(12) United States Patent
Nomiya

(10) Patent No.: US 8,450,615 B2
(45) Date of Patent: May 28, 2013

(54) CERAMIC MULTILAYER SUBSTRATE

(75) Inventor: Masato Nomiya, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 282 days.

(21) Appl. No.: 12/713,199

(22) Filed: Feb. 26, 2010

(65) Prior Publication Data

US 2010/0147568 A1     Jun. 17, 2010

Related U.S. Application Data

(63) Continuation of application No. PCT/JP2008/063530, filed on Jul. 28, 2008.

(30) Foreign Application Priority Data

Aug. 29, 2007 (JP) ................. 2007-223249

(51) Int. Cl.
    *H05K 1/03*     (2006.01)
    *H05K 1/11*     (2006.01)
    *H05K 7/00*     (2006.01)

(52) U.S. Cl.
    USPC ........... 174/255; 174/257; 174/260; 361/760; 361/792

(58) Field of Classification Search
    None
    See application file for complete search history.

(56) References Cited

U.S. PATENT DOCUMENTS

| | | | |
|---|---|---|---|
| 6,788,545 B2 * | 9/2004 | Nakayama | 361/752 |
| 7,381,283 B2 * | 6/2008 | Lee et al. | 156/89.12 |
| 7,440,256 B2 * | 10/2008 | Hongo et al. | 361/306.1 |
| 2002/0177360 A1 | 11/2002 | Nakayama | |
| 2006/0115637 A1 | 6/2006 | Hongo et al. | |
| 2007/0178729 A1 | 8/2007 | Ohtsuki | |

FOREIGN PATENT DOCUMENTS

| | | |
|---|---|---|
| DE | 102 24 057 A1 | 1/2004 |
| JP | 5-110258 A | 4/1993 |
| JP | 8-162765 A | 6/1996 |
| JP | 2000-277916 A | 10/2000 |

(Continued)

OTHER PUBLICATIONS

Official Communication issued in corresponding European Patent Application No. 08791765.4, mailed on Aug. 11, 2010.
Official Communication issued in corresponding European Patent Application No. 08 791 765.4, mailed on Apr. 1, 2011.

(Continued)

*Primary Examiner* — Jayprakash N Gandhi
*Assistant Examiner* — Dion Ferguson
(74) *Attorney, Agent, or Firm* — Keating & Bennett, LLP

(57) ABSTRACT

A ceramic multilayer substrate in which cracks resulting from the difference in shrinkage caused by heat or thermal shrinkage caused by firing can be prevented effectively between an end surface electrode and a substrate main body. The substrate main body includes alternately stacked first and second ceramic layers, and including first recesses provided in end surfaces of at least two adjacent ceramic layers so as to communicate with each other, and an electroconductive end surface electrode is disposed in the first recesses in the substrate main body. The first and the second ceramic layer each have a sintering start temperature and a sintering end temperature, and at least one of the sintering start temperature and the sintering end temperature is different between the first and the second ceramic layer. The substrate main body has a second recess in at least one of the ceramic layers having the first recesses so as to communicate with the first recess and lie between other ceramic layers. In the second recess, an electroconductive protrusion connected to the end surface electrode is disposed.

12 Claims, 10 Drawing Sheets

FOREIGN PATENT DOCUMENTS

| | | |
|---|---|---|
| JP | 2002-26523 A | 1/2002 |
| JP | 2002-237680 A | 8/2002 |
| JP | 2003-101225 A | 4/2003 |
| JP | 2005-93846 A | 4/2005 |
| JP | 2006-165108 A | 6/2006 |
| JP | 2007-207802 A | 8/2007 |

OTHER PUBLICATIONS

Official Communication issued in International Patent Application No. PCT/JP2008/063530, mailed on Aug. 19, 2008.

Official Communication issued in corresponding European Patent Application No. 08791765.4, mailed on Feb. 7, 2012.

* cited by examiner

1

CERAMIC MULTILAYER SUBSTRATE

BACKGROUND OF THE INVENTION

1. Field of the Invention

The present invention relates to a ceramic multilayer substrate, and more specifically to a ceramic multilayer substrate including an end surface electrode in addition to an electrode disposed on a main surface thereof.

2. Description of the Related Art

Some of the proposed ceramic multilayer substrates including a plurality of ceramic layers have an end surface electrode disposed at an end surface other than the main surfaces of the main body of the substrate.

For example, Japanese Unexamined Patent Application Publication No. 2000-277916 proposes that an end surface electrode 2 be formed, as shown in the sectional views of FIGS. 11 and 12 and the perspective view of FIG. 13. In this instance, a cross through-groove is formed in the thickness direction in a substrate main body 10 including ceramic layers 10a to 10h. An electroconductive member 13 is formed by filling the cross through-groove with an electroconductive paste. The electroconductive member 13 is divided into end surface electrodes 2 by a dividing groove 15. Then, an anchor electroconductive member 7 is connected to the end surface electrode 2 to prevent the end surface electrode 2 from separating from the substrate main body 10.

However, the anchor electroconductive member is formed to a depth equal to the thickness of the end surface electrode in the thickness direction of the substrate main body, and the ceramic of the substrate main body and the metal of the anchor electroconductive member have a difference in thermal shrinkage. This difference makes it difficult to completely prevent the metal end surface electrode from separating or falling.

When the substrate main body is sintered, the ceramic layers shrink in the main surface direction of the substrate main body. Accordingly, a crack occurs between the end surface electrode and the substrate main surface to reduce the strength of the substrate.

SUMMARY OF THE INVENTION

In order to overcome the above-described disadvantages, preferred embodiments of the present invention provide a ceramic multilayer substrate in which cracks resulting from the difference in shrinkage caused by heat or thermal shrinkage caused by firing can be prevented effectively between the end surface electrode and the substrate main body.

A ceramic multilayer substrate according to a preferred embodiment of the present invention includes a substrate main body including a plurality of ceramic layers and including first recesses formed in end surfaces of at least two adjacent layers of the ceramic layers so as to communicate with each other, and an electroconductive end surface electrode disposed in the first recesses. The substrate main body includes a second recess in at least one layer of the ceramic layers including the first recesses so as to communicate with the first recess and lie between other ceramic layers. In the second recess, an electroconductive protrusion connected to the end surface electrode is disposed. Preferably, the ceramic layers include a first ceramic layer and a second ceramic layer. At least one of the sintering start temperature and the sintering end temperature is different between the first and the second ceramic layer. Preferably, the first ceramic layers and the second ceramic layers are alternately stacked to form the substrate main body.

In this structure, the protrusion disposed in the second recess protrudes from the end surface electrode in a direction perpendicular or substantially perpendicular to the direction in which the ceramic layers are stacked, and extends into the ceramic layers. Thus, the end surface electrode is prevented from moving in the stacking direction of the ceramic layers. The bonding strength between the end surface electrode and the substrate main body thus can be enhanced to completely prevent the end surface electrode from falling off the substrate main body.

In addition, the interface between the end surface electrode and the protrusion defines a three-dimensionally complex structure. Consequently, the interface between the end surface electrode and protrusion and the substrate main surface is not confined in a specific direction, and the contact area of the end surface electrode and protrusion with the substrate main surface is increased. Accordingly, cracks resulting from the difference in shrinkage between the end surface electrode and protrusion and the substrate main body caused by heat or thermal shrinkage caused by firing can be prevented between the end surface electrode and the substrate main body more effectively than in a structure in which only the end surface electrode is provided without forming the protrusion.

In addition, since the substrate main body includes alternately stacked first and second ceramic layers having sintering-start temperatures and sintering-end temperatures at least one of which are different, the substrate can be prevented from being shrunk in the main surface direction by firing. However, the difference of shrinking behaviors is increased between the ceramic layers having the effect of preventing the shrinkage and the end surface electrode. Accordingly, protrusions are arranged such that a relief structure is located in the boundary between the end surface electrode and the ceramic layers. This structure can reduce stress concentration, and can prevent the end surface electrode from cracking during firing.

Preferably, a plurality of the protrusions are connected to the single end surface electrode so as to have a distance therebetween in a direction in which the ceramic layers are stacked.

By providing the protrusions, the end surface electrode can be prevented from separating or cracking more effectively.

Preferably, at least one of the first recesses has an extension in at least one of the directions parallel or substantially parallel to the end surfaces of the ceramic layers, and the second recess is defined by the extension. The protrusion in the second recess is exposed at the end surface of the ceramic layers.

The protrusion more effectively prevents the end surface electrode from separating or cracking and, in addition, facilitates the manufacture. This structure is thus advantageous in practice.

Preferably, at least one protrusion is connected to the end surface electrode at the entire boundary between the first recessed and the end surface electrode when viewed from above.

In this instance, the protrusion is provided in an area that is as large as possible along the boundary between the first recesses and the end surface electrode, so that the protrusion can prevent the end surface electrode from separating or falling more effectively.

Preferably, the length of the protrusion in the direction in which the distance from the end surface electrode is increased is at least about 1.25 times as large as the distance between the adjacent protrusions in the direction in which the ceramic layers are stacked.

In this instance, the length of the protrusion embedded in the substrate main body is increased, so that the protrusion can prevent the end surface electrode from separating or cracking more effectively and sufficiently.

Preferably, one of the first and the second ceramic layer contains a ceramic material that sinters independently at a higher temperature than the sintering end temperature of the other ceramic layer.

In this instance, one of the ceramic layers prevents the other ceramic layer from being shrunk in the surface direction of the ceramic layers by firing, so that the separation and the occurrence of cracks can be prevented. Thus, the resulting ceramic multilayer substrate can be highly precise.

Preferably, one of the first and the second ceramic layer shrinks about 40% or more of the maximum shrinkage exhibited at a temperature less than or equal to the sintering-end temperature of the other ceramic layer at the sintering-start temperature of the other ceramic layer. The shrinkage mentioned herein refers to a deformation behavior of about 5% or more, and does not refer to a deformation of about 5% or less caused by, for example, removing the binder.

In this instance, one of the ceramic layers prevents the other ceramic layer from being shrunk in the surface direction of the ceramic layer by firing the ceramic multilayer substrate, so that the occurrence of cracks can be prevented effectively.

Preferably, the ceramic material is at least one oxide selected from the group consisting of Al, Zr, Ti, Si, Nb, and Ta, for example.

The use of such a high temperature sintering ceramic material allows the first ceramic layer to produce the effect of preventing shrinkage, and allows the end surface electrode and the protrusion to have a sufficient bonding strength.

Preferably, at least one of the first recesses is formed in the first ceramic layer, and the protrusion disposed in the second recess is bounded on at least one of the surfaces thereof in the direction in which the ceramic layers are stacked by the second ceramic layer.

In this instance, the protrusion has a sufficient bonding strength with the second ceramic layer and, thus, can sufficiently prevent the end surface electrode from separating or falling.

Preferably, the protrusion is electrically connected to an in-plane conductor disposed between the ceramic layers.

In this instance, the bonding portion of the in-plane conductor with the protrusion is located between the ceramic layers. This structure enhances the reliability of the bonding portion more than the structure in which the in-plane conductor is directly connected to an end surface electrode along the first recess in the substrate main body.

Preferably, the end surface electrode and the protrusion are made of an electroconductive material containing Cu, Ag, Ni or Pd, for example.

In this instance, even if the first ceramic layer contains a low-temperature co-fired ceramic, the end surface electrode can have high electroconductivity.

Preferred embodiments of the present invention can prevent cracks resulting from the difference in shrinkage caused by heat or the difference in thermal shrinkage caused by firing can be prevented effectively between the end surface electrode and the substrate main body.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to FIGS. 1 to 10C.

Figure 1:
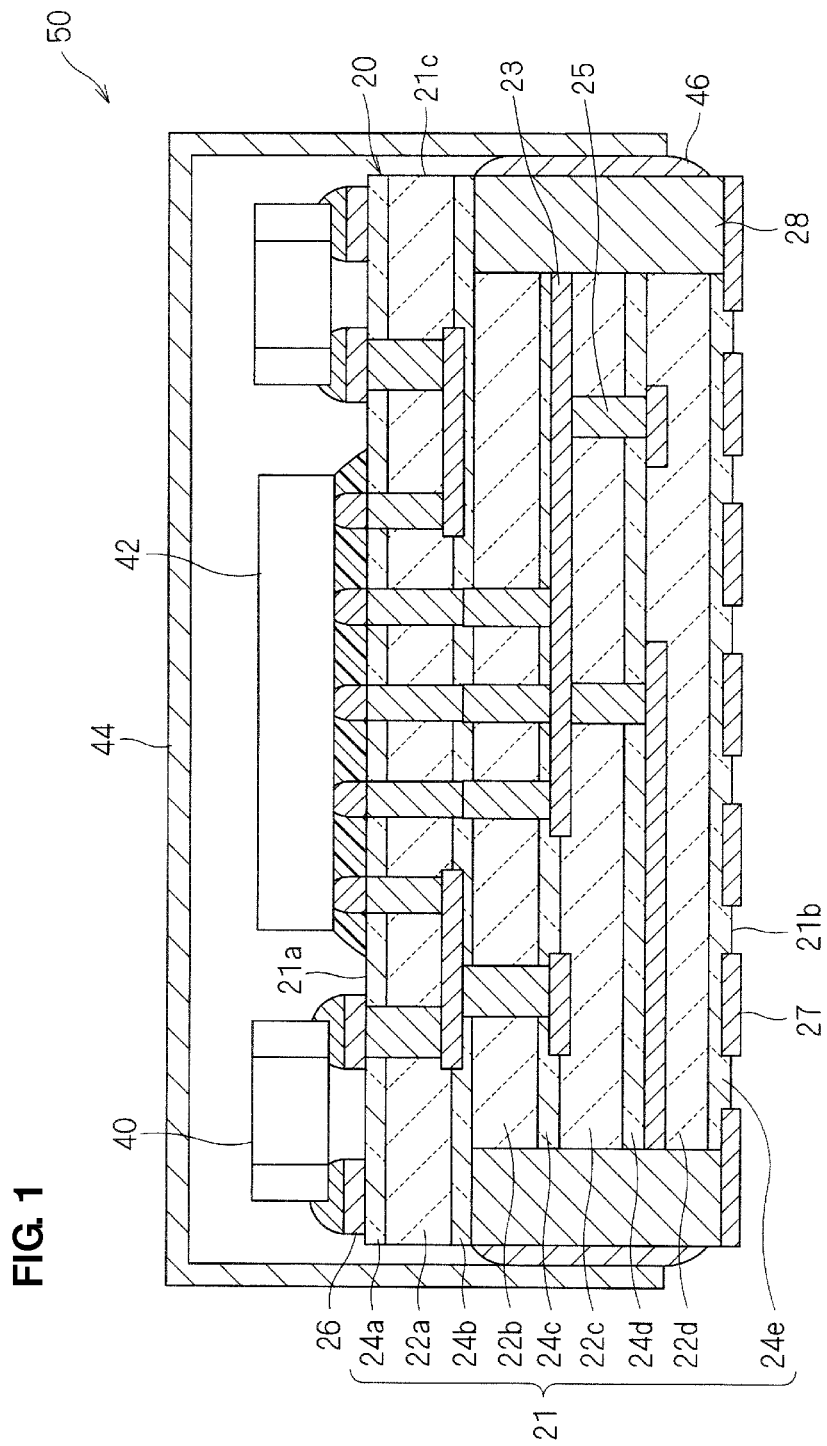
FIG. 1 is a sectional view of a module component including a ceramic multilayer substrate according to a preferred embodiment of the present invention.

A ceramic multilayer substrate 20 according to a first preferred embodiment will now be described with reference to FIGS. 1 to 7D. FIG. 1 is a schematic sectional view of a module component 50 including a ceramic multilayer substrate 20.

As shown in FIG. 1, the ceramic multilayer substrate 20 includes a substrate main body 21 and mounted components 40 and 42 mounted on the upper surface 21a of the substrate main body 21, and may be covered with a metal case 44 as needed.

The substrate main body 21 of the ceramic multilayer substrate 20 includes first ceramic layers 22a to 22d and second ceramic layers 24a to 24e that are alternately stacked. The first ceramic layers 22a to 22d and the second ceramic layers 24a to 24e are bounded on their main surfaces by each other.

The first ceramic layers 22a to 22d are formed by sintering a first ceramic material, and the characteristics of the ceramic multilayer substrate 20 depend on the first ceramic layers 22a to 22d. The second ceramic layers 24a to 24e contain a second ceramic material. The first ceramic material and the second ceramic material are selected so that at least one of the sintering-start temperature and the sintering-end temperature is different between the first ceramic layers 22a to 22d and the second ceramic layers 24a to 24e.

Preferably, the first ceramic layers 22a to 22d have a thickness of, for example, about 8 μm to about 100 μm after firing. The first ceramic layers 22a to 22d do not necessarily have the same thickness.

Preferably, the thickness of the first ceramic layers 22a to 22d is set to a maximum thickness or less with which the shrinkage in the main surface direction of the first ceramic layers 22a to 22d can be restrained during firing according to the thickness of the second ceramic layers 24a to 24e so that the second ceramic layers 24a to 24e can prevent the shrinkage of the first ceramic layers 22a to 22d during firing, as described in detail later.

The first ceramic material preferably includes a component (for example, glass component) that can permeate the second ceramic layers 24a to 24e during firing. The first ceramic material is preferably an LTCC (low temperature co-fired ceramic) that can be fired at a relatively low temperature, for example, about 1050° C. or less, from the viewpoint of firing the first ceramic material simultaneously with conductors made of silver, copper or other low melting point metals, such as an in-plane conductor 23, a via-conductor 25, external electrodes 26 and 27, and the end surface electrode 28. Examples of the first ceramic material include glass ceramic containing alumina and borosilicate glass, and Ba—Al—Si—B oxide ceramic producing glass components during firing.

The second ceramic material of the second ceramic layers 24a to 24e is solidified by components of the first ceramic material penetrating the second ceramic layers 24a to 24e from the first ceramic layers 22a to 22d. Consequently, the second ceramic layers are solidified and bound with the first ceramic layers 22a to 22d. For example, $Al_2O_3$ and ZrO are suitably used as the second ceramic material. In addition, $TiO_2$, $SiO_2$, $Nb_2O_5$ and $Ta_2O_5$ may be used.

The second ceramic material has a higher sintering temperature than the first ceramic material, and the second ceramic layers 24a to 24e of the end product contain the second ceramic material in an unsintered state. Hence, only the first ceramic layers 22a to 22d are shrunk by firing, while the second ceramic layers 24a to 24e are not shrunk. Consequently, the second ceramic layers 24a to 24e prevent the first ceramic layers 22a to 22d from being shrunk in the main surface direction by fining. In addition, the second ceramic 24a to 24e are solidified and bound by components penetrating from the first ceramic material, as described above. Accordingly, depending on the states of the first ceramic layers 22a to 22d and second ceramic layers 24a to 24e, desired restraining ability, and firing conditions in the strict sense, the thickness of the second ceramic layers 24a to 24e after firing is preferably about about 1 μm to about 8 μm, for example.

In the substrate main body 21, in-plane conductors 23 are locally disposed between the first ceramic layers 22a to 22d and the second ceramic layers 24a to 24e. The in-plane conductors 23 form circuit elements, such as capacitors and inductors. Also, via-conductors 25 passing through some of the ceramic layers 22a to 22d and 24a to 24e are provided in the main body 21.

External electrodes 26 and 27 are disposed on the upper surface 21a and the lower surface 21b of the substrate main body 21, respectively. The external electrode 26 on the upper surface 21a of the substrate main body 21 includes mounted components 40 and 42 thereon. The external electrode 27 on the lower surface 21b of the substrate main body 21 is used for mounting the module component 50 on another circuit board.

End surface electrodes 28 are disposed at the end surfaces 21c of the substrate main body 21. More specifically, first recesses are formed in the end surfaces of the ceramic layers 22b, 24c, 22c, 24d, 22d and 24e so as to communicate with each other in the direction in which the ceramic layers 22b, 24c, 22c, 24d, 22d and 24e are stacked (in the vertical direction in FIG. 1), and the end surface electrodes 28 are each disposed in the corresponding first recesses. The end surface electrodes 28 are each connected to the external electrode 27 on the lower surface 21b of the substrate main body 21. The metal case 44 may be bonded to the end surface electrodes 28 with solder 46.

The in-plane conductors 23 and the via-conductors 25 define electrical wiring and electrical circuits in the substrate main body 21, and are electrically connected to the external electrodes 26 and 27 and the end surface electrodes 28 exposed outside the substrate main body.

The conductor portions of the in-plane conductors, the via-conductors, the external electrodes and the end surface electrodes can be made of any material selected from generally known materials, as long as it mainly contains an electroconductive component that can be fired simultaneously with the first ceramic layers 22a to 22d. For example, Cu, Ag, Ni, Pd and their oxides and alloys can be used.

The end surface electrode can have various structures. Details will be described with reference to FIGS. 2 to 7D.

Figure 2:
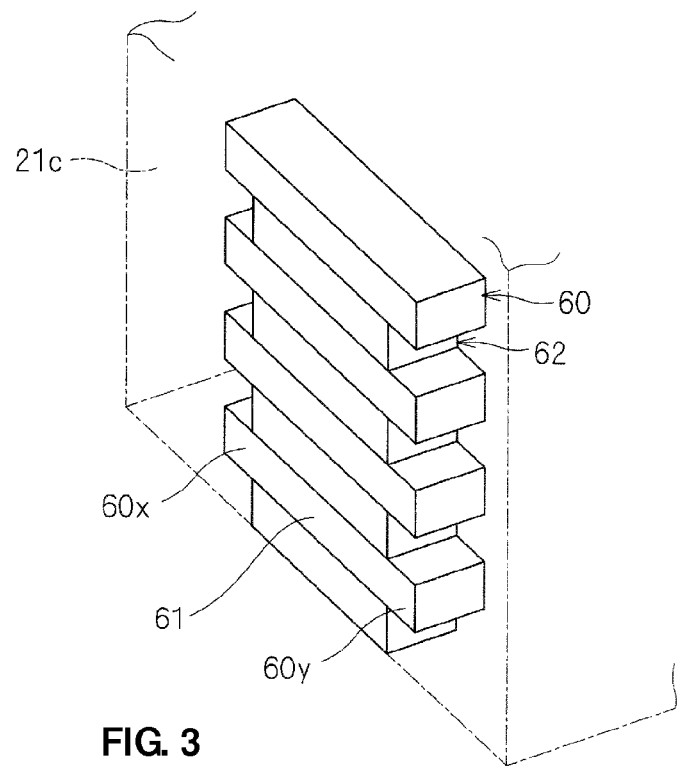
FIG. 2 is a perspective view of an end surface electrode according to a preferred embodiment of the present invention.
Figure 3:
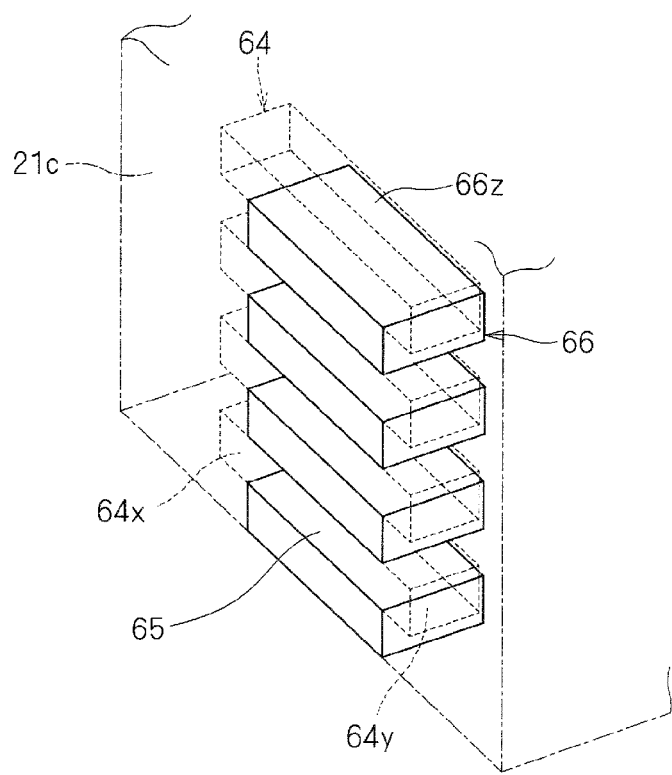
FIG. 3 is a perspective view of an end surface electrode according to a preferred embodiment of the present invention.

FIGS. 2 and 3 are each a perspective view of conductor members of an end surface electrode disposed in cutouts formed in the ceramic layers in an end surface 21c of a substrate main body 21.

FIG. 2 shows the structure in which conductor members 60 and 62 having the same depth and different widths are disposed in respective cutouts in the adjoining ceramic layers along the end surface 21c of the substrate main body 21. The depth mentioned herein refers to the length of the conductor members 60 and 62 in the direction from the end surface 21c of the substrate main body 21 to the inside of the substrate main body 21, and the width refers of the length of the conductor members in the lateral direction at the end surface 21c. When the ceramic layers are viewed from above in the stacking direction of the ceramic layers (in the vertical direction in FIG. 2), the shorter conductor members 62 are completely aligned with each other in the vertical direction, while the ends 60x and 60y of the longer conductor members 60 extend from both ends of the shorter conductor members 62. The overlap portion of the conductor members 60 and 62 when viewed from above defines the end surface electrode 61, and the ends 60x and 60y of the conductor member 62 protruding from the overlap portion define protrusions.

In other words, the end surface electrode 61 is disposed in first recesses, and the protrusions 60x and 60y are disposed in second recesses. The second recesses are formed between the ceramic layers. The cutout of the ceramic layer in which the shorter conductor member 62 is disposed defines only the first recess. The cutout in the ceramic layer in which the longer conductor member 60 is disposed defines both the first recess and the second recess communicating with the first recess.

FIG. 3 shows the structure in which conductor members and 66 having different depths and widths are disposed in respective cutouts in the adjoining ceramic layers so as to be flush with the end surface 21c of the substrate main body 21. When the ceramic layers are viewed in their stacking direction (in the vertical direction in FIG. 3), the shorter conducting portions 66 are completely aligned with each other in the vertical direction, while the ends 60x and 60y of the longer conducting portions 64 indicated by dashed lines extend from both ends of the shorter conducting portions 66. Unlike the structure shown in FIG. 2, the shorter conductor members 66 have a larger depth than the longer conductor member 64. Accordingly, only the external ends of the shorter conductor members 66 are flush with those of the longer conductor members 64 at the end surface 21c of the substrate main body 21, while the internal ends 66z of the shorter conductor members 66 protrude from the overlap with the conductor members 64. The common overlap portion of the conductor members 64 and 66 defines the end surface electrode 65, and the portions of protruding from the common overlap portion, that is, the ends 64x and 64y of the longer conductor members 64 and the internal portions 66z of the shorter conductor members 66 define protrusions.

In other words, the end surface electrode 65 is disposed in first recesses, and the protrusions 64x, 64y and 66z are disposed in second recesses. The second recesses are located between the ceramic layers. Although the cutouts of the ceramic layers in which the conductor members 64 and 66 are disposed each define the first recess and the second recess communicating with the first recess, the second recess of the ceramic layer in which the longer conductor member 64 is disposed do not overlap with the second recess of the ceramic layer in which the shorter conductor member 66 is disposed.

FIGS. 4A to 4E are fragmentary enlarged sectional views of structures of the main portion of the ceramic layers and the conductor members before firing. As shown in FIGS. 4A to 4E, the conductor members can be disposed in various manners in first recesses formed in ceramic layer units, each including at least one ceramic layer.

Figure 4A:
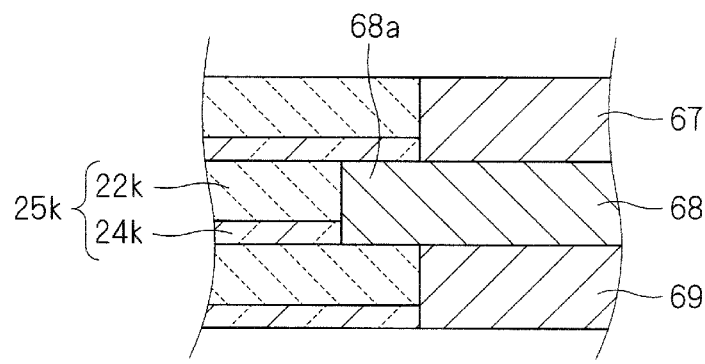
FIG. 4A is a fragmentary enlarged sectional view of main portions around a protrusion according to a preferred embodiment of the present invention.

FIG. 4A shows the structure in which conductor members 67, 68 and 69 are disposed in respective ceramic layer units 25k each including a first ceramic layer 22k and a second ceramic layer 24k so as to form a protrusion 68a.

Figure 4B:
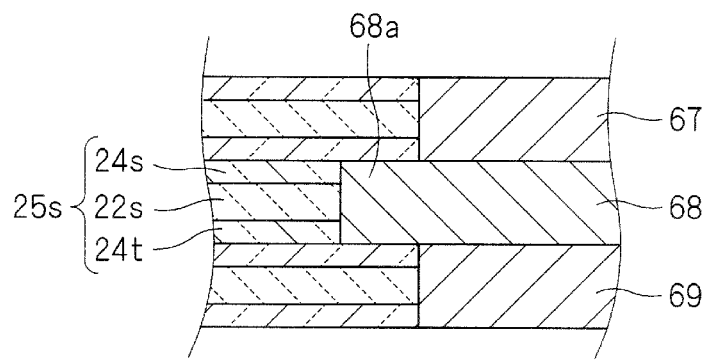
FIG. 4B is a fragmentary enlarged sectional view of main portions around a protrusion according to a preferred embodiment of the present invention.

FIG. 4B shows the structure in which conductor members 67, 68 and 69 are disposed in respective ceramic layer units 25s, each including a first ceramic layer 22s and second ceramic layers 24s and 24t disposed on both the main surfaces of the first ceramic layer 22s, so as to form a protrusion 68a.

Figure 4C:
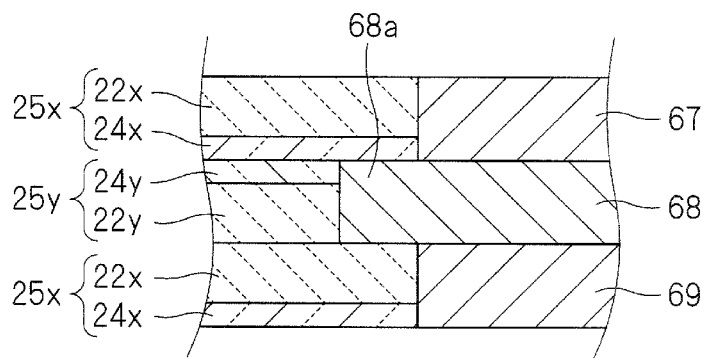
FIG. 4C is a fragmentary enlarged sectional view of main portions around a protrusion according to a preferred embodiment of the present invention.

FIG. 4C shows the structure in which a protrusion 68a is formed by disposing conductor members 67, 68 and 69 in ceramic layer units 25x and 25y including first ceramic layers 22x and 22y and second ceramic layers 24x and 24y, as in the structure shown in FIG. 4A. However, the ceramic layer unit 25y having a first recess in which the conductor member 68 defining a protrusion 68a is disposed includes the first and second ceramic layers 22y and 24y formed in a different order from the first and second ceramic layers 22x and 24x of the adjoining ceramic layer units 25x.

Figure 4D:
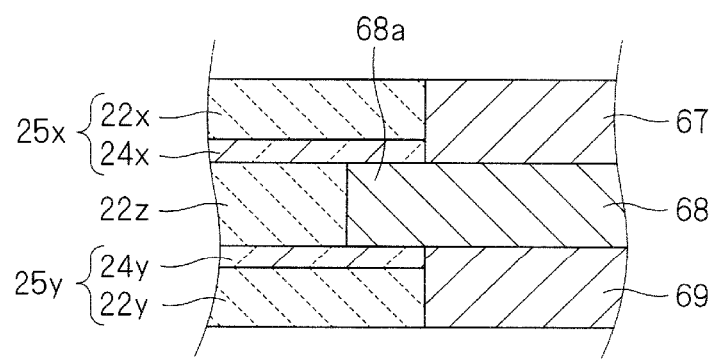
FIG. 4D is a fragmentary enlarged sectional view of main portions around a protrusion according to a preferred embodiment of the present invention.

FIG. 4D shows the structure in which a protrusion 68a is formed by disposing conductor members 67, 68 and 69 in ceramic layer units 25x and 25y. In this structure, one of the ceramic layer units 25x and 25y having a first recess in which the conductor member 68 defining a protrusion 68a is disposed includes a first ceramic layer 22z, and the adjoining ceramic layer units 25y each includes a first ceramic layer 22y and a second ceramic layer 24y in contact with the protrusion 68a.

Figure 4E:
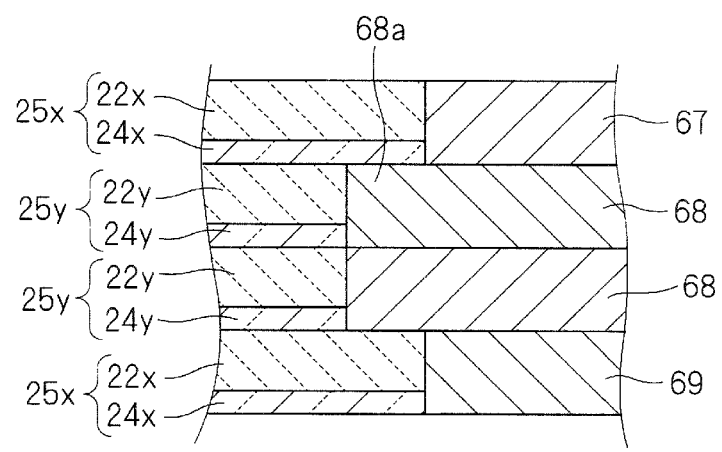
FIG. 4E is a fragmentary enlarged sectional view of main portions around a protrusion according to a preferred embodiment of the present invention.

FIG. 4E shows the structure in which a protrusion 68a is formed by disposing conductor members 67, 68 and 69 in ceramic layer units 25x and 25y. In this structure, one of the ceramic layer units 25x and 25y having a first recess in which the conductor member 68 including the protrusion 68a is disposed includes a plurality of layers of first ceramic layers and second ceramic layers. Although the conductor members having the protrusions 68a are disposed between the ceramic layer units 25x in the structure shown in FIG. 4E, the conductor members having the protrusions 68a may be separated by a plurality of ceramic layer units.

By providing a structure in which the second ceramic layer 24k, 24s, 24t, 24x or 24y is in contact with at least one of the main surfaces of the protrusion 68a, as shown in FIGS. 4A to 4E, the protrusion 68a can have a sufficient bonding strength to the second ceramic layer 24k, 24s, 24t, 24x or 24y to prevent the end surface electrode from separating or cracking effectively.

As shown in the sectional views of FIGS. 5A-5E taken along a side surface of the substrate main body in the vicinity of the side surface, the conductor members disposed in the first recesses and/or second recesses in the ceramic layers to define the end surface electrode and the protrusions can be stacked in various manners.

Figure 5A:
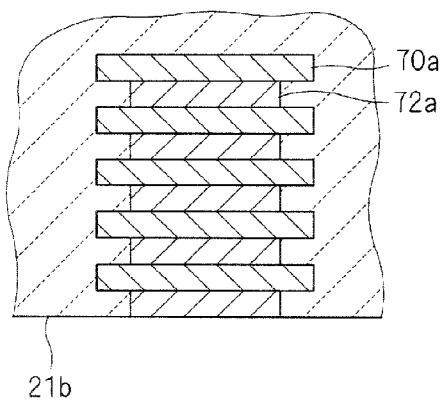
FIGS. 5A-5E are sectional views of end surface electrodes according to a preferred embodiment of the present invention.

FIG. 5A shows the structure in which conductor members 70a and 72a having different widths are alternately disposed in the first recesses in the ceramic layers so that both ends of the longer conductor members 70a define protrusions, as in the structure shown in FIG. 2.

Figure 5B:
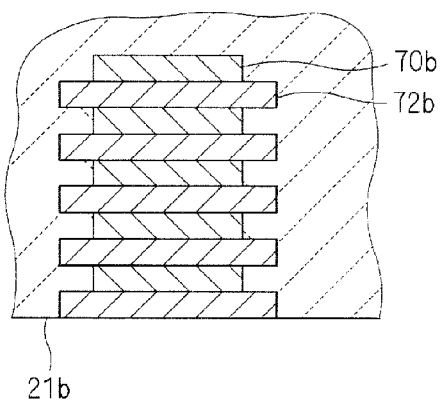

As with FIG. 5A, FIG. 5B shows the structure in which conductor members 70b and 72b having different widths are alternately disposed in the first recesses in the ceramic layers so that both ends of the longer conductor members 72b define the protrusions. However, the shorter conductor members 70b and the longer conductor members 72b are stacked in a different order from the structure shown in FIG. 5A.

Figure 5C:
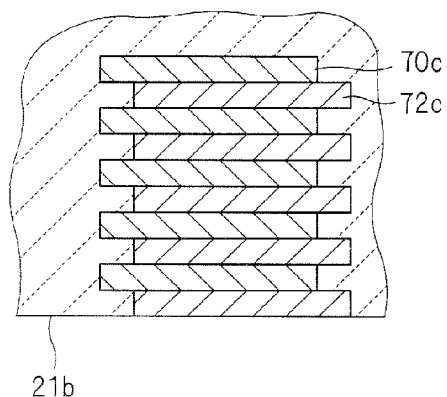

FIG. 5C shows the structure in which conductor members having the same width are staggered in the lateral direction so that first ends of the conductor members define protrusions alternately at the right and the left side.

Figure 5D:
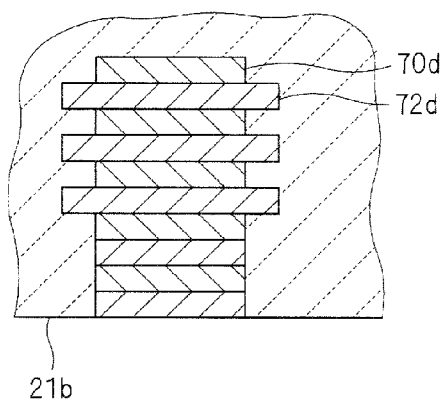

FIG. 5D shows the structure in which conductor members 70d and 72d having different widths are alternately disposed in a certain region in the stacking direction (upper region in the figure) of the ceramic layers so that both ends of the longer conductor members 70d define the protrusions.

Figure 5E:
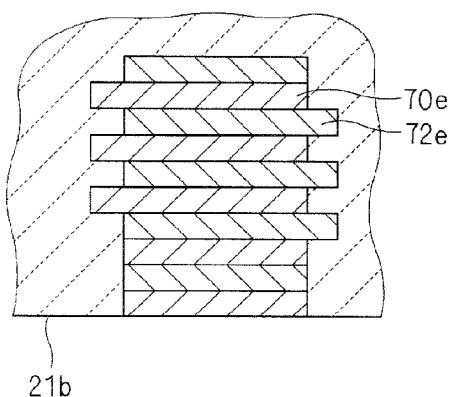

FIG. 5E shows the structure in which conductor members 70e and 72e having the same width are staggered in the lateral direction in a certain region in the stacking direction of the ceramic layers (upper region in the figure) so that one ends of the conductor members 70e and 72e define the protrusions alternately at the right and the left side.

FIGS. 6A-6H and 7 are fragmentary enlarged views of side surfaces and their vicinities of substrate main bodies when viewed in the stacking direction of the ceramic layers.

Figure 6A:
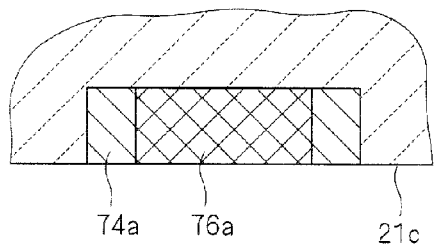
FIGS. 6A-6H are plan views of end surface electrodes according to a preferred embodiment of the present invention.

FIG. 6A shows the structure in which rectangular conductor members 74a and 76a having different widths are disposed respectively in a first and a second recess and another first recess in the ceramic layers so that both ends of the longer conductor member 74a protrude from both ends of the shorter conductor member 76a to define protrusions.

Figure 6B:
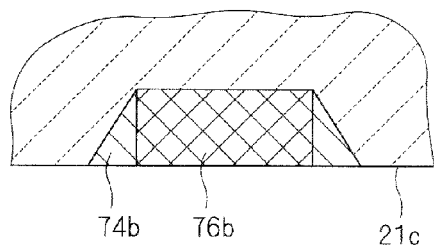

FIG. 6B shows the structure in which a trapezoidal conductor member 74b and a rectangular conductor member 76b are disposed respectively in a first and a second recess and another first recess in the ceramic layers so that the triangular portions at both ends of the trapezoidal conductor member 74b protrude from both ends of the rectangular conductor member 76b to define protrusions.

Figure 6C:
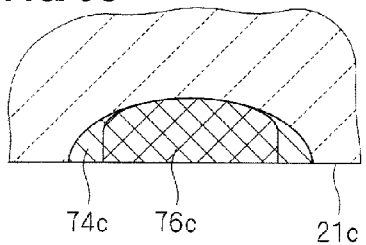

FIG. 6C shows the structure in which a substantially half oval conductor member 74c and a substantially pentagonal conductor member 76c are disposed respectively in a first and a second recess and another first recess of the ceramic layers so that the substantially triangular portions at both ends of the substantially half oval conductor member 74c protrude from both ends of the substantially pentagonal conductor member 76c to define protrusions.

Figure 6D:
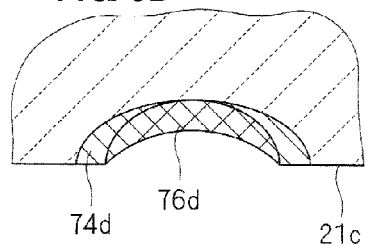

FIG. 6D shows the structure in which a substantially half oval ring-shaped conductor member 74d and a substantially crescent conductor member 76d are disposed respectively in a first and a second recess and another first recess in the ceramic layers so that the substantially sector portions at both ends of the substantially half oval ring-shaped conductor member 74d protrude from both ends of the substantially crescent conductor member 76d to define protrusions.

Figure 6E:
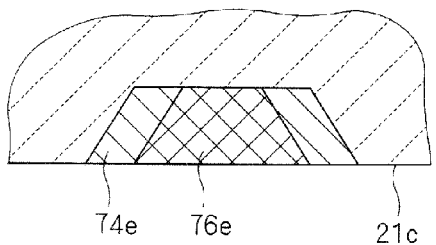

FIG. 6E shows the structure in which trapezoidal conductor members 74e and 76e having the same depth and different bases are disposed in a first and a second recess and another first recess in the ceramic layers so that the parallelograms of the conductor member 74e having longer bases protrude from the conductor member 74e having shorter bases to define protrusions.

Figure 6F:
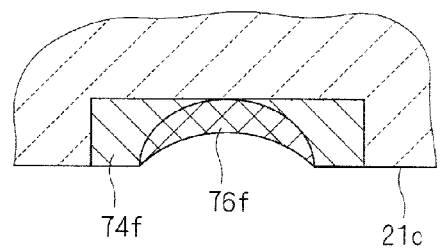

FIG. 6F shows the structure in which a partially cut-off rectangular conductor member 74f and a substantially crescent conductor member 76f are disposed respectively in a first and a second recess and another first recess in the ceramic layers so that the ends and inward portions of the partially cut-off rectangular conductor member 74f protrude from the substantially crescent conductor member 76f to define protrusions.

Figure 6G:
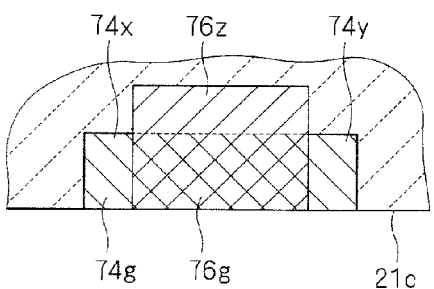

FIG. 6G shows the structure in which rectangular conductor members 74g and 76g having different depths and widths as in the structure shown in FIG. 3 are disposed in first and second recesses in the ceramic layers so that protrusions are defined by the end portions 74x and 74y of the larger-width conductor member 74g protruding from the smaller-width conductor member 76g and the inward portion 76z of the larger-depth conductor member 76g protruding from the shorter-depth conductor member 74g.

Figure 6H:
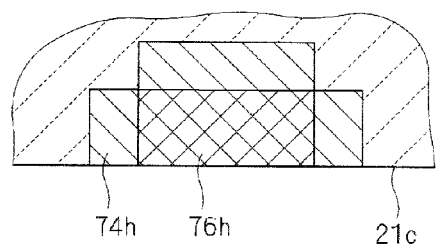

FIG. 6H shows the structure in which a substantially T-shaped conductor member 74h and a rectangular conductor member 76h are disposed in first and second recesses in the ceramic layers so that protrusions are defined by the three rectangular portions of the T-shaped conductor member 74h protruding from three sides of the rectangular conductor member 76h.

In a relief structure in which the protrusions are connected to the end surface electrode, as described above, the protrusions in the second recesses in the ceramic layers protrude from the end surface electrode in a direction perpendicular or substantially perpendicular to the stacking direction of the ceramic layers, and extends into the ceramic layers. Thus, the protrusions hinder the end surface electrode from moving in the stacking direction of the ceramic layers. Consequently, the end surface electrode can be completely prevented from falling off the substrate main body.

In addition, at least one of the sintering-start temperature and the sintering-end temperature of the ceramic layers is different between the first ceramic layers and the second ceramic layers, and such first and second ceramic layers are alternately stacked to form the substrate main body. Thus, the substrate can be prevented from being shrunk in the main surface direction by firing. However, the shrinking behavior of the ceramic layers capable of preventing the shrinkage differs from that of the end surface electrode significantly. Accordingly, protrusions are provided so that a relief structure is located in the boundary between the end surface electrode and the ceramic layers. This structure can reduce stress concentration, and can prevent the end surface electrode from separating or cracking during firing.

Figure 7A:
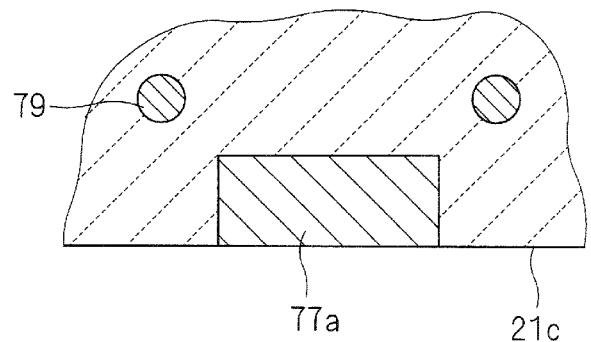
FIGS. 7A-7D are plan views of end surface electrodes according to a preferred embodiment of the present invention.
Figure 7B:
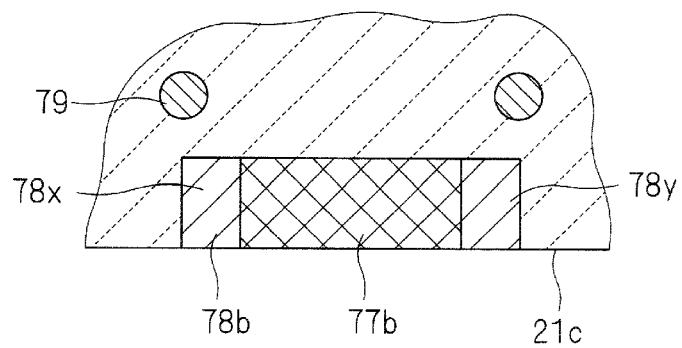
Figure 7C:
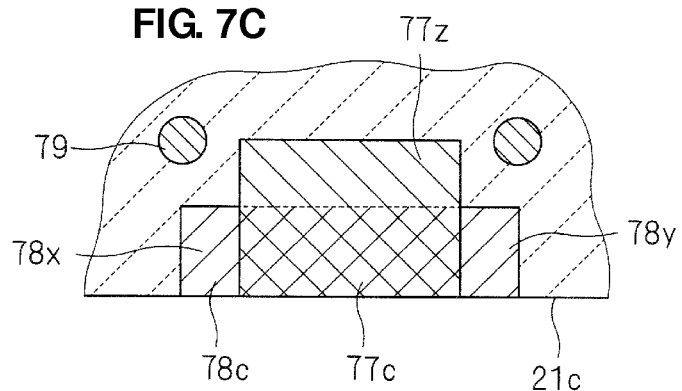
Figure 7D:
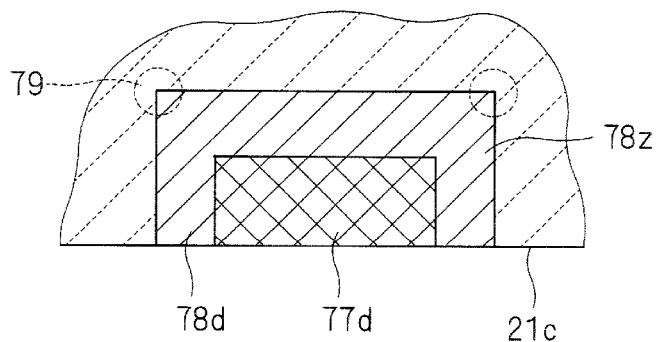

If an end surface electrode 77a having no protrusion is disposed close to via-conductors 79, as shown in FIG. 7A, conductor members 77b and 78b having different widths may be used in the same design region to provide protrusions 78x and 78y at both ends of the end surface electrode, as shown in FIG. 7B, or conductor members 77c and 78c having different depths and widths may be used to provide three protrusions 77z, 78x and 78y along three sides of the end surface electrode, as shown in FIG. 7C. However, as shown in FIG. 7D, if a substantially U-shaped protrusion 78z is formed using substantially similar rectangular conductor members 77d and 78d having different areas, the conductor member 78d having a larger area and the via-conductors 79 interfere with each other. In such a case, the positions of the via-conductors 79 need to be changed. In other words, structure redesigned in such a manner that protrusions are provided as shown in FIG. 7B or 7C can prevent the end surface electrode from falling or cracking.

A manufacturing example of the ceramic multilayer substrate will now be described.

A Ba—Al—Si—B oxide ceramic material and alumina were used as the first ceramic layers 22a to 22d and the second ceramic layers, respectively. The first ceramic layers 22a to 22d were controlled to have a thickness of 20 μm after firing, and the second ceramic layers were controlled to have a thickness of 3 μm after firing.

In-plane conductors, via-conductors, external electrodes and end surface electrodes were formed of an electroconductive paste mainly containing Cu.

In order to reduce the difference in shrinking behavior previously between the via-conductors and the ceramic multilayer substrate, resin beads or glass components were added to the via-conductors in addition to the Cu. For the glass components, Si—B—Ba glass was used, which has substantially the same composition as a diffusing glass that can diffuse from the first ceramic layers 22a to 22d to the second ceramic layers to solidify the second ceramic layers.

The end surface electrode and the protrusions can be generally formed as below.

First, ceramic green sheets, which are ceramic layer units each including a first ceramic layer and/or a second ceramic layer, are prepared. Subsequently, through-holes are formed in the ceramic green sheets using a die or the like and are then filled with an electroconductive paste by printing or other methods to form portions acting as via-conductors, external electrodes and the end surface electrode. An electroconductive paste is applied onto the ceramic green sheets by printing or other methods to form in-plane conductors. Subsequently, the resulting ceramic green sheets are stacked in a predetermined order and pressed in a predetermined direction to complete a ceramic green sheet compact. The ceramic green sheet compact is intended for a plurality of ceramic multilayer substrates.

Subsequently, dividing grooves are formed so as to divide the via-conductors in the ceramic green sheet compact with a dicer. At this time, the dividing grooves are formed to a depth extending to some midpoint in the thickness direction of the ceramic green sheet compact without dividing the ceramic green sheet compact into slave substrates. Then, the ceramic green sheet compact having the dividing grooves is fired to obtain a ceramic compact. The ceramic compact is then divided into slave substrates.

In this instance, the ceramic multilayer substrate is obtained by firing a piece of the ceramic green sheet compact at a maximum temperature of about 950° C. to about 1000° C. under conditions where the temperature and the atmosphere are controlled to predetermined values. At this time, the piece of the ceramic green sheet compact is fired at a temperature at which the first ceramic material can be sintered and the second ceramic material cannot be sintered. Thus, the second green ceramic layers act to prevent the shrinkage of the first green ceramic layers that are just about to shrink. In addition, the second green ceramic layers are solidified by the components dispersing to the second green ceramic layers when the first green ceramic layers are sintered. Consequently, the resulting ceramic multilayer substrate can have high dimensional accuracy.

The firing atmosphere is appropriately controlled according to the first ceramic material and the electroconductive powder contained in the electroconductive paste.

In Manufacturing Example 1, the ceramic green sheet compact was prepared so that: the thickness (dimension in the vertical direction in FIG. 1) of the substrate main body 21 and the height (dimension in the vertical direction in FIG. 1) of the end surface electrode 28 would be about 0.7 mm and about 0.3 mm after firing, respectively; the end surface electrode 28 and the protrusions would have depths (dimensions in the lateral direction in FIG. 1, dimensions in the vertical direction in FIGS. 6A-6H) of about 10 μm to about 170 μm after dividing; the end surface electrode 28 exposed at the end surface of the substrate main body 21 would have a width (dimension in the lateral direction of the overlap of the conductor members stacked in the vertical direction, hereinafter may be referred to as recess width) of about 0.6 mm; and the protrusions connected to the end surface electrode, protruding from the end surface electrode would have a dimension (hereinafter referred to as height difference or protrusion length) of about 50 μm, for example.

Table 1 shows the incidence of cracks in the vicinity of the end surface electrodes of samples in which the adjacent protrusions had an interlayer distance of about 40 μm therebetween after firing, and in which the combination of the recess width and the protrusion length of the end surface electrodes were varied. As shown in Table 1, the protrusion length or height difference was preferably about 1.25 times or more, more preferably about 2.5 times or more, as large as the interval between the adjacent protrusions in the stacking direction of the ceramic layer (hereinafter may be referred to as the interlayer distance). For example, when the interlayer distance between the adjacent protrusions is about 20 μm, cracks can be prevented by setting the protrusion length to about 25 μm or more.

TABLE 1

| Recess width | Height difference (protrusion length) (mm) | | | |
|---|---|---|---|---|
| (mm) | 0.1 | 0.075 | 0.05 | 0.025 |
| 0.4 | 0% | 0% | 0% | 65% |
| 0.6 | 0% | 0% | 0% | 29% |
| 0.8 | 0% | 0% | 0% | 54% |

Even if the protrusion length is increased, the effect of the protrusions is not lost. On the contrary, the binding area is increased to enhance the adhesion to the case, which will be described later. However, even if the protrusion length is increased more than required, the adhesion is not increased to the extent that can be expected according to the increase of the protrusion length. In addition, an excessive increase of the protrusion length reduces the efficiency in arranging other electrodes disposed around the protrusions. Accordingly, the protrusion length is preferably about 1.25 to about 8 times the interlayer distance, for example.

After the resulting ceramic multilayer substrate was subjected to surface treatment if necessary, a metal case was bonded to the end surface electrodes. In this instance, the surface treatment was applied by electroless plating of Ni and Au.

The metal case is connected to the end surface electrodes disposed at opposing sides of the ceramic multilayer substrate with solder, and loads were applied onto the upper surface of the metal case. The load at which the ceramic multilayer substrate was broken was defined as the case bonding strength, and was compared with various conditions.

In Manufacturing Example 2, a ceramic multilayer substrate was prepared and evaluated in the same manner as in Manufacturing Example 1, except that the substrate main body of the ceramic multilayer substrate was not provided with the second ceramic layers, that is, except that the substrate main body was constituted of only the first ceramic layers.

In Comparative Example 1 corresponding to Manufacturing Example 1, a ceramic multilayer substrate having end surface electrodes not connected with protrusions was prepared in the same manner, and the same evaluation was performed.

Figure 8:
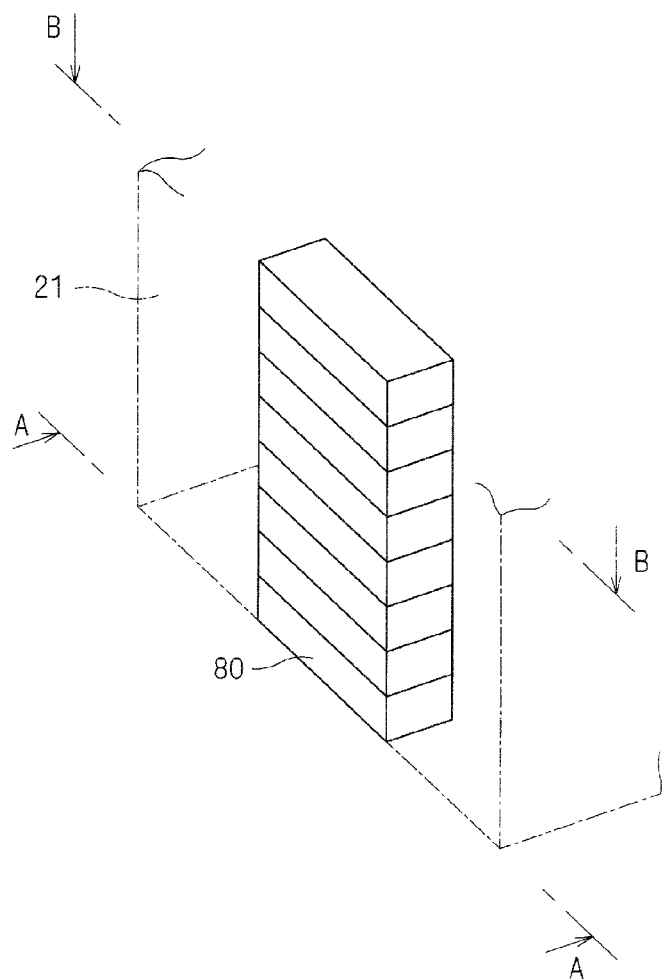
FIG. 8 is a perspective view of an end surface electrode according to a comparative example.
Figure 9A:
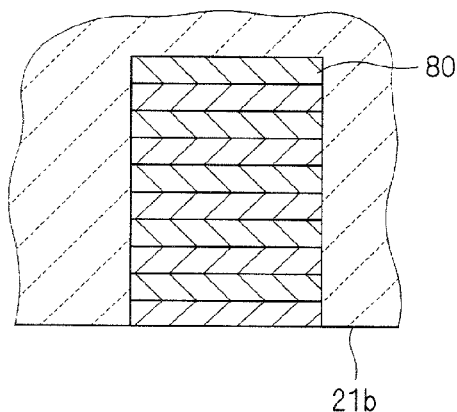
FIGS. 9A and 9B are sectional views of an end surface electrode according to a comparative example.
Figure 9B:
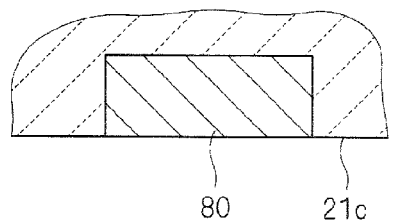

In Comparative Example 1, as schematically shown in the perspective view of FIG. 8, the sectional view of FIG. 9B taken along line A-A in FIG. 8, and the sectional view of FIG. 9A taken along line B-B in FIG. 8, the conductor members of the end surface electrode 80 are completely aligned with each other when viewed in the stacking direction of the ceramic layers (in the vertical direction in FIG. 8).

Figure 10A:
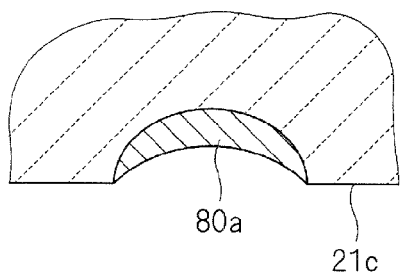
FIGS. 10A-10C are sectional views of end surface electrodes according to a reference example.
Figure 10B:
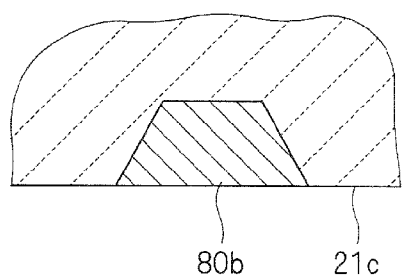
Figure 10C:
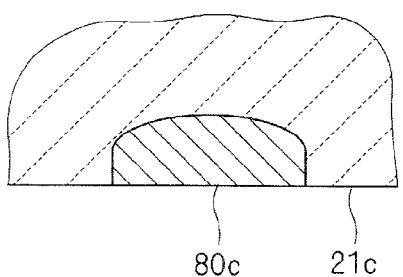
Figure 11:
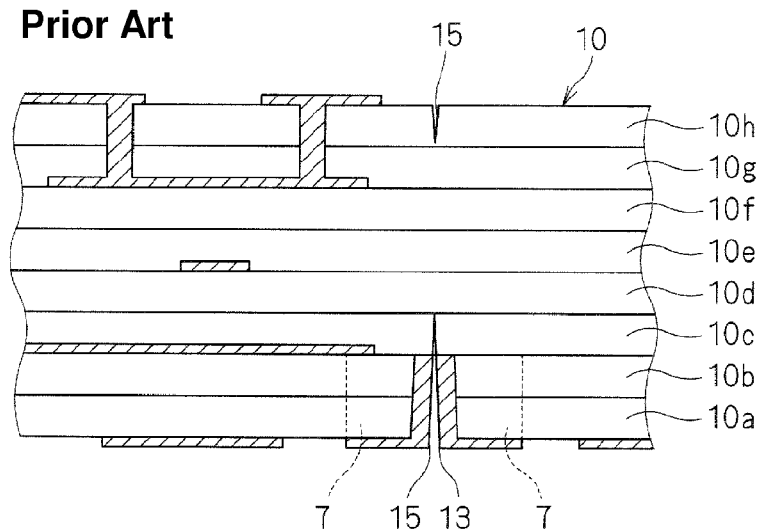
FIG. 11 is a fragmentary sectional view of a substrate according to a conventional structure.
Figure 12:
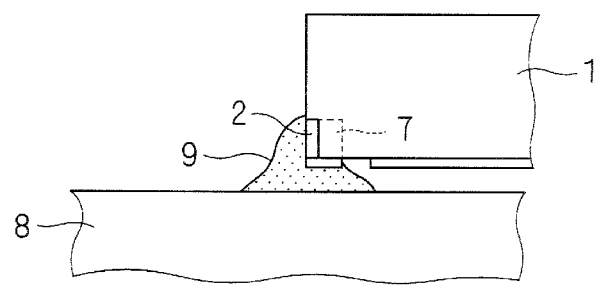
FIG. 12 is a fragmentary sectional view of a substrate according to a conventional structure.
Figure 13:
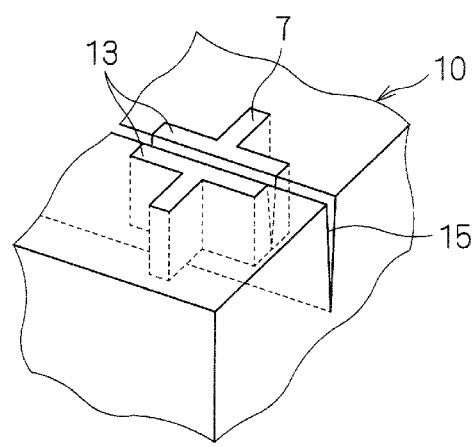
FIG. 13 is a perspective view of the bottom of a substrate according to a conventional structure.

The end surface electrode is formed to have shapes shown in FIGS. 10A to 10C in addition to the rectangular shape shown in FIG. 9B. The end surface electrode 80 having the rectangular section shown in FIG. 9B corresponds to the end surface electrode shown in FIG. 6B of Manufacturing Example 1. The end surface electrode 80a having a crescent section shown in FIG. 10A corresponds to the end surface electrode shown in FIG. 6D of Manufacturing Example 1. The end surface electrode 80b having a trapezoidal section shown in FIG. 10B corresponds to the end surface electrode shown in FIG. 6E of Manufacturing Example 1. The end surface electrode 80c having a pentagonal section shown in FIG. 10C corresponds to the end surface electrode shown in FIG. 6C of Manufacturing Example 1.

For Comparative Example 2 corresponding to Manufacturing Example 2, a ceramic multilayer substrate having end surface electrodes not connected with protrusions were prepared in the same manner, and the same evaluation was performed.

Tables 2 to 5 show the results of evaluation for the incidence of cracks in Manufacturing Examples 1 and 2 and Comparative Examples 1 and 2. Fifty samples were evaluated for the incidence of cracks in each example or comparative example.

In the tables, Structures A-E in the column of "relief structure" correspond to the structures shown in FIGS. 5A to 5E, and the Known structure corresponds to the structure shown in FIG. 9A. Sections A-F in the column of "sectional shape" correspond to the sections shown in FIGS. 6A to 6F, and the Known structure corresponds to the structure shown in FIG. 9A. B-E shaped section recesses in the column of "sectional shape" are sectional shapes B to E not having protrusions. A shaped section recess in the column of "sectional shape" is sectional shape A not having protrusions. Structures A-D in the column of "Sheet structure" correspond to the structures shown in FIGS. 4A to 4D. "Depth" refers to the total length of the end surface electrode and protrusion in the direction perpendicular to the end surface 21c of the substrate main body 21 (in the vertical direction in FIGS. 6A-6H).

The following Table 2 shows the evaluation results of Manufacturing Example 1.

TABLE 2

| Manufacturing Example 1 | | | | |
|---|---|---|---|---|
| Relief structure | Sectional shape | Sheet structure | Depth | Incidence of cracks |
| Structures A-C | Sections A-F | Structures A-D | 10 μm | 0% |
| Structures A-C | Sections A-F | Structures A-D | 30 μm | 0% |
| Structures A-C | Sections A-F | Structures A-D | 50 μm | 0% |
| Structures A-C | Sections A-F | Structures A-D | 70 μm | 0% |
| Structures A-C | Sections A-F | Structures A-D | 90 μm | 0% |
| Structures A-C | Sections A-F | Structures A-D | 110 μm | 0% |
| Structures A-C | Sections A-F | Structures A-D | 130 μm | 0% |
| Structures A-C | Sections A-F | Structures A-D | 150 μm | 0% |
| Structures A-C | Sections A-F | Structures A-D | 170 μm | 0% |
| Structures D, E | Section A | Structure A | 50 μm | 4% |
| Structures D, E | Section A | Structure A | 90 μm | 10% |
| Structures D, E | Section A | Structure A | 150 μm | 14% |

Cracks in Structures D and E occurred in regions other than the relief structure formed of the end surface electrode and the protrusions.

The following Table 3 shows the evaluation results of Comparative Example 1.

TABLE 3

| Comparative Example 1 | | | | |
|---|---|---|---|---|
| Relief structure | Sectional shape | Sheet structure | Depth | Incidence of cracks |
| Known structure | B-E shaped section recess | Structures A-D | 10 μm | 0% |
| Known structure | B-E shaped section recess | Structures A-D | 30 μm | 2 to 4% |
| Known structure | B-E shaped section recess | Structures A-D | 50 μm | 4 to 10% |
| Known structure | B-E shaped section recess | Structures A-D | 70 μm | 10 to 18% |
| Known structure | B-E shaped section recess | Structures A-D | 90 μm | 16 to 20% |
| Known structure | B-E shaped section recess | Structures A-D | 110 μm | 22 to 34% |
| Known structure | B-E shaped section recess | Structures A-D | 130 μm | 28 to 68% |
| Known structure | B-E shaped section recess | Structures A-D | 150 μm | 34 to 92% |
| Known structure | B-E shaped section recess | Structures A-D | 170 μm | 45 to 100% |

The incidence of cracks in Comparative Example 1 is increased in the order of Sections B, C, D and E.

The following Table 4 shows the evaluation results of Manufacturing Example 2.

TABLE 4

| Manufacturing Example 2 | | | | |
|---|---|---|---|---|
| Relief structure | Sectional shape | Sheet structure | Depth | Incidence of cracks |
| Structures A-C | Sections A-F | — | 10 μm | 0% |
| Structures A-C | Sections A-F | — | 30 μm | 0% |
| Structures A-C | Sections A-F | — | 50 μm | 0% |
| Structures A-C | Sections A-F | — | 70 μm | 0% |
| Structures A-C | Sections A-F | — | 90 μm | 0% |
| Structures A-C | Sections A-F | — | 110 μm | 0% |
| Structures A-C | Sections A-F | — | 130 μm | 0% |
| Structures A-C | Sections A-F | — | 150 μm | 0% |
| Structures A-C | Sections A-F | — | 170 μm | 0% |
| Structures D, E | Section A | — | 50 μm | 0% |
| Structures D, E | Section A | — | 90 μm | 4% |
| Structures D, E | Section A | — | 150 μm | 6% |

Cracks in Structures D and E occurred in regions other than the relief structure formed of the end surface electrode and the protrusions.

The following Table 5 shows the evaluation results of Comparative Example 2.

TABLE 5

| Comparative Example 2 | | | | |
|---|---|---|---|---|
| Relief structure | Sectional shape | Sheet structure | Depth | Incidence of cracks |
| Known structure | A shaped section recess | — | 10 μm | 0% |
| Known structure | A shaped section recess | — | 30 μm | 2% |
| Known structure | A shaped section recess | — | 50 μm | 4% |
| Known structure | A shaped section recess | — | 70 μm | 4% |
| Known structure | A shaped section recess | — | 90 μm | 10% |
| Known structure | A shaped section recess | — | 110 μm | 10% |
| Known structure | A shaped section recess | — | 130 μm | 12% |
| Known structure | A shaped section recess | — | 150 μm | 14% |

TABLE 5-continued

Comparative Example 2

| Relief structure | Sectional shape | Sheet structure | Depth | Incidence of cracks |
|---|---|---|---|---|
| Known structure | A shaped section recess | — | 170 μm | 20% |

From the comparison between Tables 2 and 3 and the comparison between Tables 4 and 5, it is shown that the occurrence of cracks can be prevented by connecting protrusions to the end surface electrode.

Also, the structures in which a relief structure formed of the end surface electrode and protrusions is locally provided as in Structures D and E can prevent the occurrence of cracks in the vicinity of the relief structure. Thus, it is effective to localize relief structures on a portion where cracks can occur at a high rate.

For example, the end surface electrode shrinks more easily in the portion in which the second ceramic layers intended to reduce shrinkage are disposed at larger intervals than the portion in which the second ceramic layers intended to reduce shrinkage are disposed at smaller intervals. Consequently, the tensile stress applied to the second ceramic layers by the shrinkage of the end surface electrode is increased to increase the probability of a crack occurring. In such a case, cracks are reduced effectively by localizing relief structures formed of the end surface electrode and protrusions particularly on the portion where the second ceramic layers are disposed at larger intervals, and where cracks can occur at a high rate.

Metal cases were bonded with solder to samples prepared according to Manufacture Examples 1 and 2 and Comparative Examples 1 and 2 and having sectional shape A, a depth of 90 μm and sheet structure A. The samples were held on a leveled surface with the metal case facing upward, and gradually increasing loads were applied downward to the metal case. The load at the time when the case was broken was measured on 20 samples for each example or comparative example. The measurement results are shown in Table 6.

TABLE 6

| | Relief structure | Recess width | Sheet structure | Depth | Average fracture strength |
|---|---|---|---|---|---|
| Manufacture Example 1 | Structures A-C | 0.6 mm | Structure A | 10 μm | Bad |
| | Structures A-C | 0.6 mm | Structure A | 30 μm | Good |
| | Structures A-C | 0.6 mm | Structure A | 90 μm | Good |
| | Structures D, E | 0.6 mm | Structure A | 90 μm | Fair |
| | Structure G | 0.6 mm | Structure A | 90 μm + 140 μm | Excellent |
| Comparative Example 1 | Known structure | 0.6 mm | Structure A | 10 μm | Bad |
| | Known structure | 0.6 mm | Structure A | 30 μm | Bad |
| | Known structure | 0.6 mm | Structure A | 90 μm | Bad |
| | Known structure | 0.8 mm | Structure A | 90 μm | Fair |
| Manufacture Example 2 | Structures A-C | 0.6 mm | Structure A | 90 μm | Good |
| | Structures D, E | 0.6 mm | Structure A | 90 μm | Fair |
| Comparative Example 2 | Known structure | 0.6 mm | Structure A | 90 μm | Fair |
| | Known structure | 0.8 mm | Structure A | 90 μm | Good |

In the column of "average fracture strength" in the table, Bad represents 15 N or less; Fair represents 15 to 25 N; Good represents 25 to 35 N; and Excellent represents 35 N or more.

Table 6 shows that the case adhesion can be enhanced depending on the relief structure formed of the end surface electrode and protrusions. In particular, it is shown that the relief structure can produce such a high level effect as cannot be produced by simply increasing the bonding area (increasing the recess width).

Structure G (corresponding to the perspective view of FIG. 3) can enhance the adhesion while the internal design region is minimized, as described with reference to FIGS. 7A-7D.

Samples having the structure shown in FIG. 6H instead of the structure shown in FIG. 6G corresponding to Structure G produced the same effect, but their results are not shown in Table 6.

Thus, by connecting protrusions to the end surface electrode to form a relief structure, the end surface electrode can be completely prevented from falling off the substrate main body, as described above, and, thus, the separation resulting from the difference in shrinkage caused by heat or thermal shrinkage caused by firing can be prevented between the end surface electrode and the substrate main body effectively.

The present invention is not limited to the preferred embodiments described above, and various modifications may be made.

For example, the end surface electrode may extend more between the main surfaces of the substrate main body. In this structure, the end surface electrode is liable to fall off in the stacking direction of the ceramic layers unless protrusions are formed. By providing protrusions, the end surface electrode can be completely prevented from falling in the stacking direction of the ceramic layers. Thus, the presence of protrusions is highly effective. As for the structure of the ceramic layers, the relationship between the sintering temperatures of the first and the second ceramic layers is not limited because the present invention relates to an electrode structure producing a larger effect when the sintering temperatures of the first ceramic layer and the second ceramic layer have a large difference. This does not depend on whether or not the second ceramic layer is solidified by the component diffusing from the first ceramic layer. For example, the first and the second ceramic layer may sinter independently. Even if the behavior of thermal deformation differs significantly between the ceramic layer and the via-conductor, the electrode structure of preferred embodiments of the present invention is effective. In such a case, the ceramic layers may be composed of a single type of layers.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ceramic multilayer substrate comprising:
a substrate main body including a plurality of ceramic layers, first recesses provided in end surfaces of at least two adjacent ceramic layers of the plurality of ceramic layers so as to communicate with each other, and at least two second recesses disposed in at least one of the at least two ceramic layers including the first recesses so as to communicate with and extend from opposed ends of at least one of the first recesses, each of the at least two second recesses being disposed between others of the plurality of ceramic layers such that portions of the others of the plurality of ceramic layers are disposed directly above and below each of the at least two recesses;
an electroconductive end surface electrode disposed in the first recesses; and
electroconductive protrusions disposed in each of the at least two second recesses and connected to the end surface electrode.

2. The ceramic multilayer substrate according to claim 1, wherein the plurality of ceramic layers include a first ceramic layer and a second ceramic layer, and at least one of the sintering start temperature and the sintering end temperature is different between the first ceramic layer and the second ceramic layer.

3. The ceramic multilayer substrate according to claim 1, a plurality of the protrusions are connected to the end surface electrode so as to have a distance therebetween in a direction in which the plurality of ceramic layers are stacked.

4. The ceramic multilayer substrate according to claim 1, wherein at least one of the first recesses includes an extension in at least one of directions parallel or substantially parallel to the end surfaces of the plurality of ceramic layers, and at least one of the at least two second recesses is defined by the extension; and
the protrusion in at least one of the second recesses is exposed at one of the end surfaces of the plurality of ceramic layers.

5. The ceramic multilayer substrate according to claim 1, wherein at least one of the protrusions is connected to the end surface electrode at an entire boundary between the first recesses in the substrate main body and the end surface electrode when viewed from above.

6. The ceramic multilayer substrate according to claim 1, wherein a length of at least one of the protrusions in a direction in which a distance from the end surface electrode is increased is at least about 1.25 times as large as a distance between adjacent ones of the protrusions in a direction in which the plurality of ceramic layers are stacked.

7. The ceramic multilayer substrate according to claim 2, wherein one of the first ceramic layer and the second ceramic layer includes a ceramic material that sinters independently at a higher temperature than the sintering end temperature of the other of the first ceramic layer and the second ceramic layer.

8. The ceramic multilayer substrate according to claim 2, wherein one of the first ceramic layer and the second ceramic layer shrinks about 40% or more of the maximum shrinkage exhibited at a temperature less than or equal to the sintering end temperature of the other of the first ceramic layer and the second ceramic layer at the sintering start temperature of that other of the first ceramic layer and the second ceramic layer.

9. The ceramic multilayer substrate according to claim 7, wherein the ceramic material is at least one oxide selected from the group consisting of Al, Zr, Ti, Si, Nb, and Ta.

10. The ceramic multilayer substrate according to claim 2, wherein at least one of the first recesses is provided in one of the first ceramic layer and the second ceramic layer, and at least one of the protrusions disposed in one of the second recesses is bounded by the other of the first ceramic layer and the second ceramic layer on at least one of the surfaces thereof in a direction in which the plurality of ceramic layers are stacked.

11. The ceramic multilayer substrate according to claim 1, wherein at least one of the protrusions is electrically connected to an in-plane conductor disposed between the plurality of ceramic layers.

12. The ceramic multilayer substrate according to claim 1, wherein the end surface electrode and the protrusions are made of an electroconductive material including Cu, Ag, Ni or Pd.

* * * * *